(12) United States Patent
Woo

(10) Patent No.: US 12,124,392 B2
(45) Date of Patent: *Oct. 22, 2024

(54) STACKED DEVICE SYSTEM

(71) Applicant: Rambus Inc., San Jose, CA (US)

(72) Inventor: Steven C. Woo, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/230,375

(22) Filed: Aug. 4, 2023

(65) Prior Publication Data

US 2024/0037055 A1   Feb. 1, 2024

Related U.S. Application Data

(63) Continuation of application No. 17/399,694, filed on Aug. 11, 2021, now Pat. No. 11,755,523.

(60) Provisional application No. 63/068,180, filed on Aug. 20, 2020.

(51) Int. Cl.
  *G06F 13/40* (2006.01)
  *G06N 3/045* (2023.01)
  *H01L 25/065* (2023.01)

(52) U.S. Cl.
  CPC ......... *G06F 13/4027* (2013.01); *G06N 3/045* (2023.01); *H01L 25/0652* (2013.01)

(58) Field of Classification Search
  CPC .. G06F 13/4027; H01L 25/0652; G06N 3/045
  See application file for complete search history.

(56) References Cited

U.S. PATENT DOCUMENTS

| | | | |
|---|---|---|---|
| 9,443,561 B1 * | 9/2016 | Roberts | G06F 13/4068 |
| 11,100,193 B2 * | 8/2021 | Gu | G06F 17/16 |
| 11,165,717 B2 * | 11/2021 | Bandic | H04L 45/74 |
| 2018/0068218 A1 | 3/2018 | Yoo et al. | |
| 2019/0355150 A1 | 11/2019 | Tremblay et al. | |
| 2020/0366625 A1 | 11/2020 | Ballard et al. | |
| 2021/0182386 A1 * | 6/2021 | Hwang | G06F 21/74 |
| 2021/0240543 A1 | 8/2021 | Han et al. | |

OTHER PUBLICATIONS

Pugsley, Seth H. et al., "NDC: Analyzing the Impact of 3D-Stacked Memory+Logic Devices on MapReduce Workloads", ISPASS14, Mar. 2014, 11 pages, Downloaded at: https://www.cs.utah.edu/~rajeev/pubs/ispass14.pdf.

(Continued)

*Primary Examiner* — Henry Tsai
*Assistant Examiner* — Christopher A Daley
(74) *Attorney, Agent, or Firm* — The Neudeck Law Firm, LLC

(57) ABSTRACT

Multiple device stacks are interconnected in a ring topology. The inter-device stack communication may utilize a handshake protocol. This ring topology may include the host so that the host may initialize and load the device stacks with data and/or commands (e.g., software, algorithms, etc.). The inter-device stack interconnections may also be configured to include/remove the host and/or to implement varying numbers of separate ring topologies. By configuring the system with more than one ring topology, and assigning different problems to different rings, multiple, possibly unrelated, machine learning tasks may be performed in parallel by the device stack system.

20 Claims, 13 Drawing Sheets

(56) References Cited

OTHER PUBLICATIONS

Schuiki, Fabian et al., "A Scalable Near-Memory Architecture for Training Deep Neural Networks on Large in-Memory Datasets", IEEE Transactions on Computers, arXiv: 1803.04783v4, [cs.DC], Oct. 17, 2018, 14 pages.

* cited by examiner

RECEIVE, BY A FIRST DEVICE STACK COMPRISING A FIRST SET OF STACKED MEMORY DEVICES AND A FIRST SET OF ONE OR MORE PROCESSING DEVICES ELECTRICALLY COUPLED TO, AND STACKED WITH, THE FIRST SET OF STACKED MEMORY DEVICES, A FIRST COPY OF A FIRST NEURAL NETWORK MODEL
402

RECEIVE, BY A SECOND DEVICE STACK COMPRISING A SECOND SET OF STACKED MEMORY DEVICES AND A SECOND SET OF ONE OR MORE PROCESSING DEVICES ELECTRICALLY COUPLED TO, AND STACKED WITH, THE SECOND SET OF STACKED MEMORY DEVICES, A SECOND COPY OF THE FIRST NEURAL NETWORK MODEL
404

TRAIN THE FIRST COPY OF THE FIRST NEURAL NETWORK MODEL USING A FIRST PORTION OF FIRST NEURAL NETWORK MODEL TRAINING DATA TO GENERATE FIRST UPDATED NEURAL NETWORK MODEL PARAMETERS
406

TRAIN THE SECOND COPY OF THE FIRST NEURAL NETWORK MODEL USING A SECOND PORTION OF FIRST NEURAL NETWORK MODEL TRAINING DATA TO GENERATE SECOND UPDATED NEURAL NETWORK MODEL PARAMETERS
408

COMMUNICATE THE FIRST UPDATED NEURAL NETWORK MODEL PARAMETERS TO THE SECOND DEVICE STACK USING A HANDSHAKE PROTOCOL
410

COMMUNICATE THE SECOND UPDATED NEURAL NETWORK MODEL PARAMETERS TO THE FIRST DEVICE STACK USING THE HANDSHAKE PROTOCOL.
412

*FIG. 4*

```
┌─────────────────────────────┐
│   CONFIGURE, IN A FIRST RING│
│ TOPOLOGY THAT INCLUDES A HOST│
│ DEVICE, THE INTERCONNECT USED│
│BY A PLURALITY OF DEVICE STACKS,│
│  THE DEVICE STACKS INCLUDING AT│
│   LEAST ONE PROCESSING DEVICE│
│              502            │
└─────────────┬───────────────┘
              │
┌─────────────┴───────────────┐
│   CONFIGURE, IN A SECOND RING│
│    TOPOLOGY THAT DOES NOT   │
│  INCLUDE THE HOST DEVICE, THE│
│   INTERCONNECT USED BY THE  │
│   PLURALITY OF DEVICE STACKS│
│              504            │
└─────────────────────────────┘
```

*FIG. 5*

CONFIGURE, INTO A FIRST RING TOPOLOGY, THE INTERCONNECT USED BY A PLURALITY OF DEVICE STACKS, THE DEVICE STACKS EACH INCLUDING AT LEAST ONE PROCESSING DEVICE
702

TRAIN RESPECTIVE COPIES OF A FIRST NEURAL NETWORK MODEL USING THE PLURALITY OF DEVICE STACKS AND RESPECTIVE PORTIONS OF A FIRST TRAINING DATA SET
704

USING THE FIRST RING TOPOLOGY, COMMUNICATE INFORMATION ABOUT RESPECTIVE TRAINED COPIES OF THE FIRST NEURAL NETWORK MODEL BETWEEN THE PLURALITY OF DEVICE STACKS
706

USING THE INFORMATION ABOUT RESPECTIVE TRAINED COPIES OF THE FIRST NEURAL NETWORK MODEL, PERFORM REDUCTION OPERATIONS USING THE PLURALITY OF DEVICE STACKS
708

CONFIGURE, INTO A SECOND RING TOPOLOGY AND A THIRD RING TOPOLOGY, THE INTERCONNECT USED BY THE PLURALITY OF DEVICE STACKS, THE SECOND RING TOPOLOGY AND THE THIRD RING TOPOLOGY INCLUDING A FIRST SUBSET AND A SECOND SUBSET OF THE PLURALITY OF DEVICE STACKS, RESPECTIVELY
710

TRAIN RESPECTIVE COPIES OF A SECOND NEURAL NETWORK MODEL USING THE FIRST SUBSET AND RESPECTIVE PORTIONS OF A SECOND TRAINING DATA SET
712

CONCURRENT WITH TRAINING THE SECOND NEURAL NETWORK MODEL USING THE FIRST SUBSET, TRAIN RESPECTIVE COPIES OF A THIRD NEURAL NETWORK MODEL USING THE SECOND SUBSET AND RESPECTIVE PORTIONS OF A THIRD TRAINING DATA SET
714

*FIG. 7A*

STACKED DEVICE SYSTEM

BRIEF DESCRIPTION OF THE DRAWINGS

FIG. 4 is a flowchart illustrating a method of operating a stacked device system.

FIG. 5 is a flowchart illustrating a method of reconfiguring a stacked device system.

FIGS. 7A-7B are a flowchart illustrating methods of training neural network models with a stacked device system.

DETAILED DESCRIPTION OF THE EMBODIMENTS

In an embodiment, stacks of interconnected devices (device stacks) include one or more Dynamic Random Access Memory (DRAM) die, a base logic die, and one or more processor die. The processor die may be interconnected vertically with the DRAM die(s) and the base die by shared through-silicon via (TSV) connections that carry data and control signal throughout the stack. Some of the control and data signals communicated via the base die may be configured for communication between device stacks and/or a host (e.g., a system on a chip—SoC). These inter-stack communication signals (interconnect) may use a handshake protocol to initiate and complete data transfers between device stacks and/or the host.

In an embodiment, multiple device stacks are interconnected in a ring topology. This ring topology may include the host so that the host may initialize and load the device stacks with data and/or commands (e.g., software, algorithms, etc.). The ring topology allows for efficient implementation of distributed/parallel machine learning algorithms—such as "Ring-AllReduce". The inter-device stack interconnections may also be configured to include/remove the host and/or to implement varying numbers of separate ring topologies. By configuring the system with more than one ring topology, and assigning different problems to different rings, multiple, possibly unrelated, machine learning tasks may be performed in parallel by the device stack system.

Figure 1:
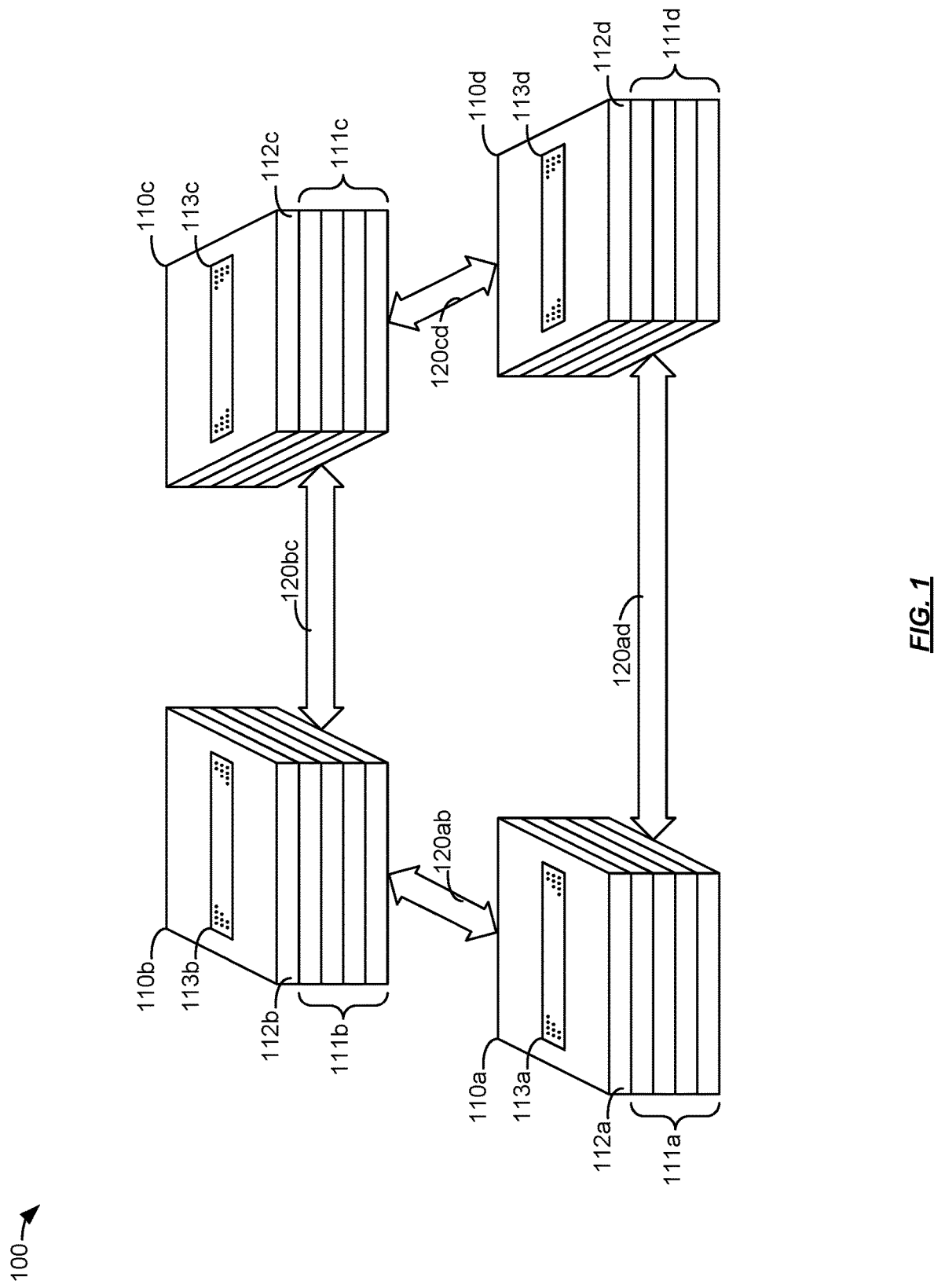
FIG. 1 is a block diagram illustrating an example stacked device system.

FIG. 1 is a block diagram illustrating an example stacked device system. In FIG. 1, system 100 comprises device stacks 110a-110d. Device stacks 110a-110d include a plurality of memory device die (e.g., DRAMs) 111a-111d, respectively. Device stacks 110a-110d also include one or more processing devices 112a-112d, respectively. Processing devices 112a-112d, are stacked with and electrically coupled to memory devices 111a-111d, respectively. Processing devices 112a-112d, may be, or include, an application specific integrated circuit (ASIC) device, a graphics processor unit (GPU), a central processing unit (CPU), a system-on-chip (SoC), or an integrated circuit device that includes many circuit blocks such as ones selected from graphics cores, processor cores, and MPEG encoder/decoders, etc.

Processing devices 112a-112d, may be electrically coupled to memory devices 111a-111d using through silicon vias (TSVs) 113a-113d, respectively. TSVs 113a-113d also couple device stacks 110a-110d to device stack interconnect 120ab, 120bc, 120cd, 120ad. Device stacks 110a-110d and/or device stack interconnect 120ab, 120bc, 120cd, 120ad may be disposed on one or more substrates not shown in FIG. 1. Device stacks 110a-110d and/or device stack interconnect 120ab, 120bc, 120cd, 120ad may be coupled to additional logic, processors, systems (e.g., host system) and/or device stacks, not shown in FIG. 1.

In FIG. 1, example device stack interconnect 120ab couples device stack 110a with device stack 110b. Example device stack interconnect 120bc couples device stack 110b with device stack 110c. Example device stack interconnect 120cd couples device stack 110c with device stack 110d. Example device stack interconnect 120ad couples device stack 110d with device stack 110a.

In an embodiment, device stacks 110a-110d may be high-bandwidth memory (HBM) compatible device stacks. Thus, device stacks 110a-110d may further include an HBM base die (not shown in FIG. 1). Memory devices 111a-111d may be HBM compatible DRAM dies. Device stacks 110a-110c (and processing devices 112a-112d, in particular) are configurable to operate on portions of a data set and communicate information via device stack interconnect 120ab, 120bc, 120cd, 120ad to perform reduction operations. To communicate information via device stack interconnect 120ab, 120bc, 120cd, 120ad, device stacks 110a-110d (and processing devices 112a-112d, in particular) may be configurable to use, for example, a handshake protocol exchanged via one or more of device stack interconnect 120ab, 120bc, 120cd, 120ad.

For example, device stacks 110a-110d may be configured with (e.g., stores) a neural network model. Each of device stacks 110a-110d is further configured (e.g., programmed) to, concurrent with the other device stacks 110a-110d) train their respective copy of the neural network model. Device stacks 110a-110d may train their respective copy of the neural network model using a respective portion of the model training data being used to train the neural network model. After training their respective copies, device stacks 110a-110d may communicate their updated model parameters (e.g., weights) with the other device stacks 110a-110d. The device stacks 110a-110d use their own updated model parameters and the updated model parameters from the other device stacks 110a-110d to produce new model parameters to be used in the next training iteration. This process may continue through further iterations and/or distributions of partial training data until the training of the neural network model is complete (e.g., converges).

An example of the type of concurrent (parallel) training algorithm described is known as Ring-AllReduce. Thus, device stacks 110a-110d and device stack interconnect 120ab, 120bc, 120cd, 120ad, may be configured into a ring type communication topology. Various additional example reduction algorithms, such as variants of Ring-AllReduce, that may be implemented by system 100 for the concurrent or parallel training of neural networks, and/or solving other compute problems, will not be discussed further herein for the sake of brevity.

In an embodiment, system 100 may be configured to work on multiple, possibly unrelated, compute problems concurrently. For example, device stacks 110a-110b may be configured to train their respective copies of a first neural network model using respective portions of model training data for the first neural network model. Concurrent with device stacks 110a-110b training the first neural network model, device stacks 110c-110d may be training respective copies of a second neural network model using respective portions of model training data for the second neural network model. The groups of device stacks 110a-110b, 110c-110d may independently perform reduction operations (e.g., Ring-AllReduce) for their respective models without communication between groups of device stacks 110a-110b, 110c-110d. Thus, each group of device stacks 110a-110b, 110c-110d can be configured to work on different neural network models in parallel with the other groups of device stacks 110a-110b, 110c-110d. In an embodiment, each group of device stacks 110a-110b, 110c-110d is configured to communicate using device stack interconnect 120ab, 120bc, 120cd, 120ad via separate (i.e., non-overlapping or disjoint) ring type communication topologies. In other words, a first group of device stacks 110a-110b communicates via a first ring topology and a second group of device stacks 110c-110d communicates via a second ring topology where the first and second ring topologies do not have any device stacks 110a-110d in common.

Figure 2A:
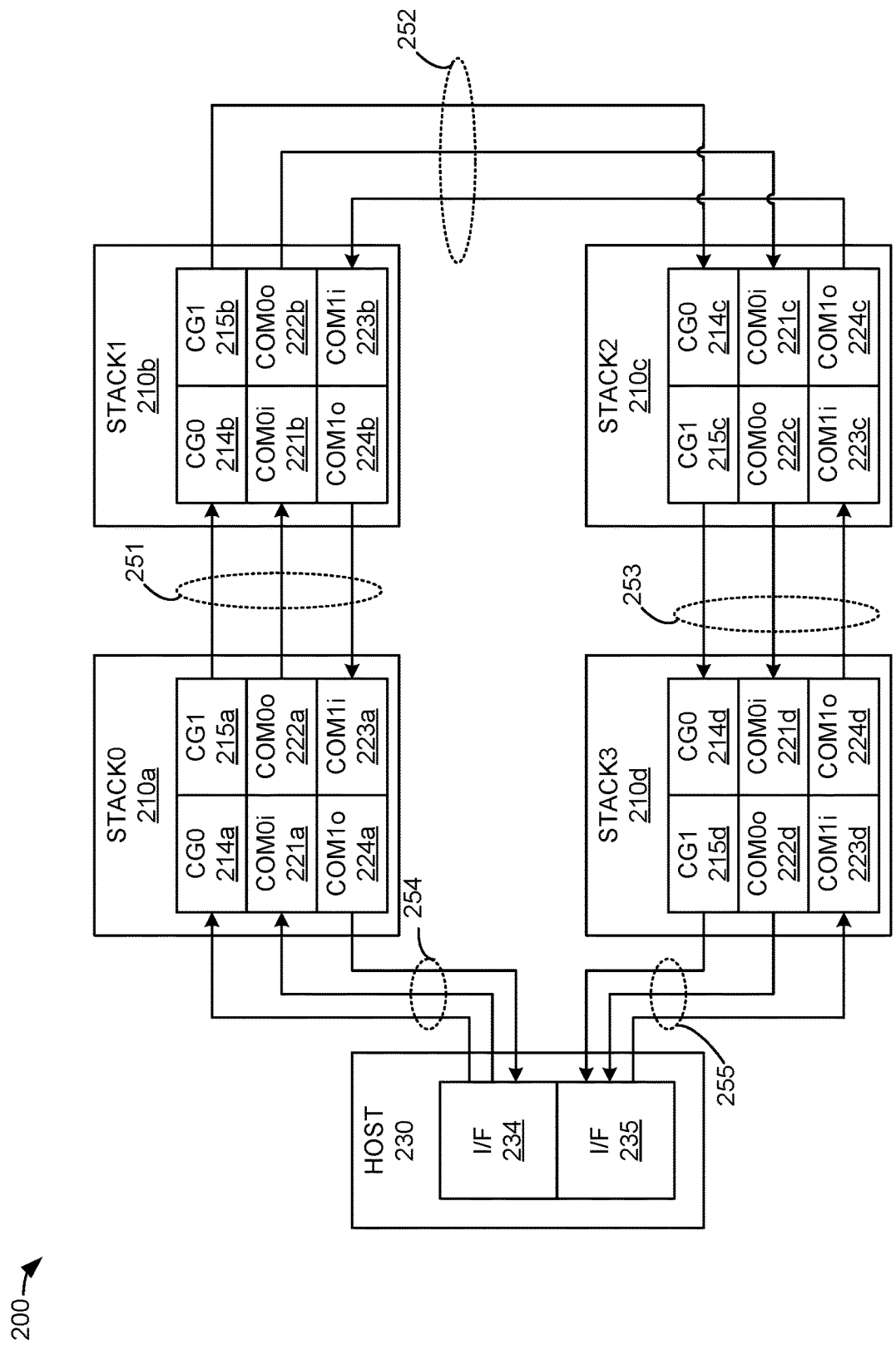
FIGS. 2A-2C are diagrams illustrating stacked device system interconnection configurations.
Figure 2B:
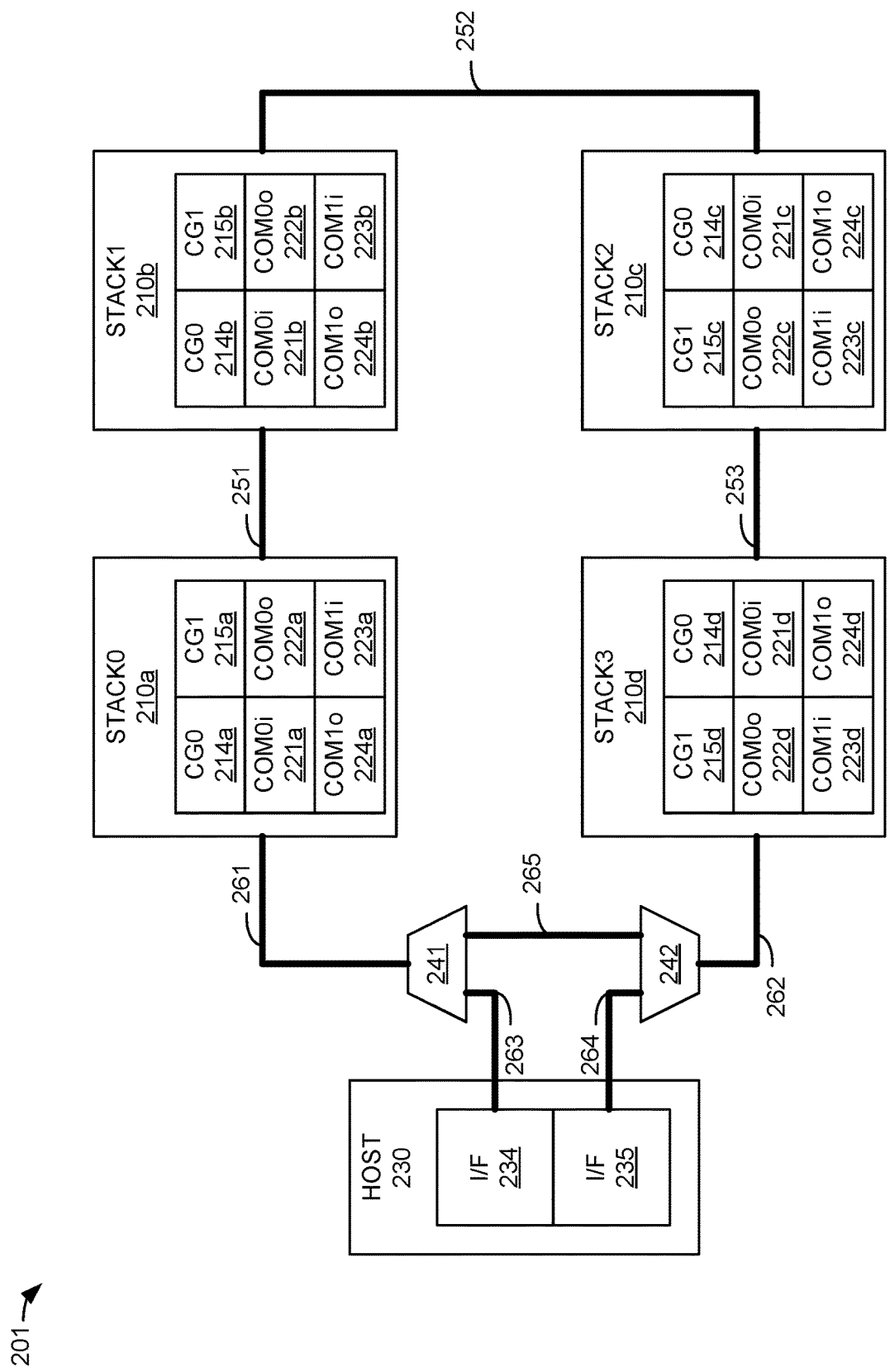
Figure 2C:
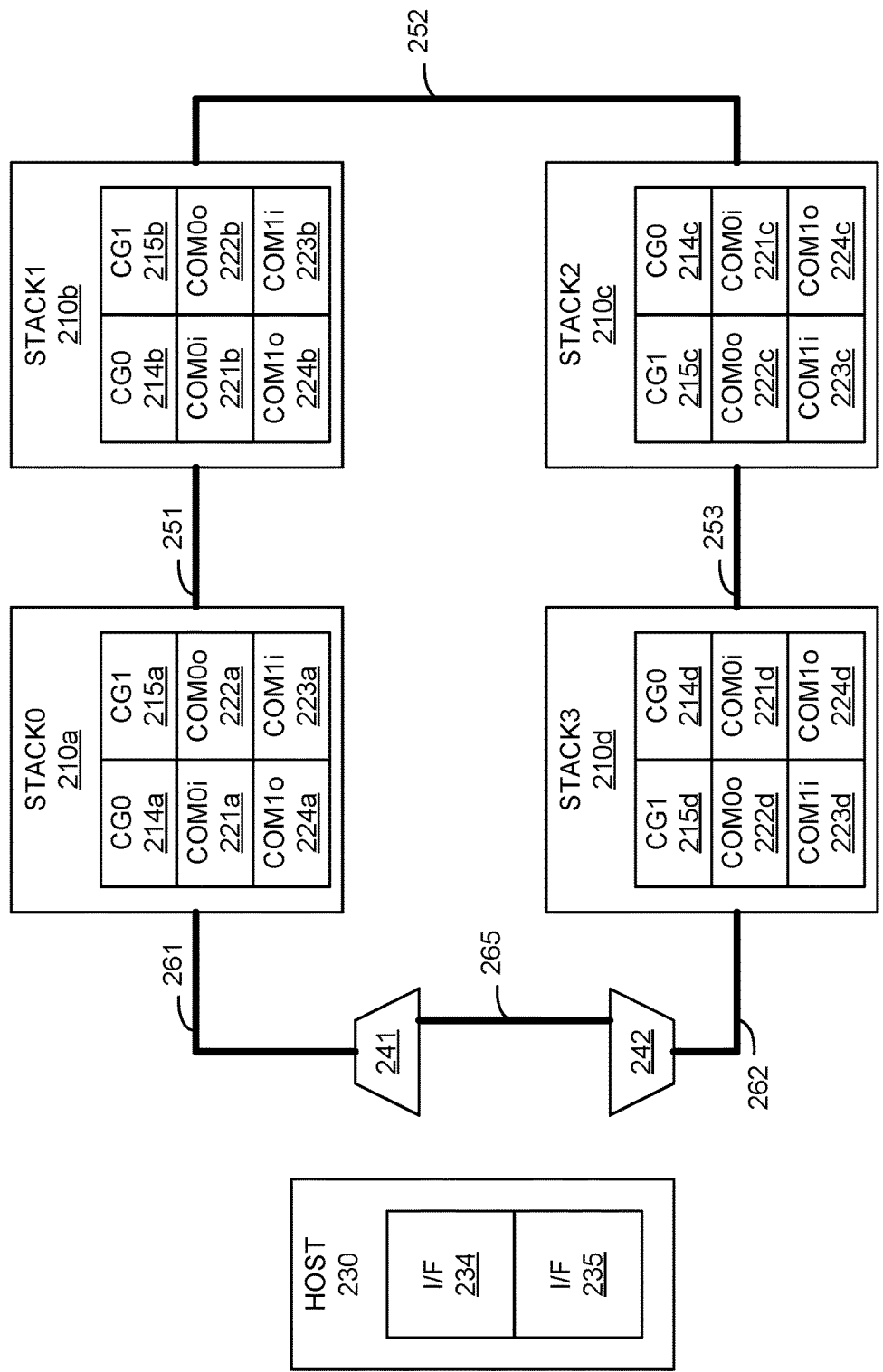

FIGS. 2A-2C are diagrams illustrating stacked device system interconnection configurations. In FIG. 2A, system 200 comprises device stacks 210a-210d, and host 230. System 200 also includes interconnects 251-255. Device stacks 210a-210d may each include a plurality of memory device die (e.g., DRAMs) and one or more processing device dies. These processing device dies and/or host 230, may be, or include, an application specific integrated circuit (ASIC) device, a graphics processor unit (GPU), a central processing unit (CPU), a system-on-chip (SoC), or an integrated circuit device that includes many circuit blocks such as ones selected from graphics cores, processor cores, and MPEG encoder/decoders, etc.

Device stacks 210a-210d respectively include channel group0 214a-214d, channel group1 215a-215d, communication link0 input (com0i) 221a-221d, communication link0 output (com0o) 222a-222d, communication link1 input (com1i) 224a-224d, and communication link1 output (com1o) 223a-223d. Host 230 includes interface (I/F) 234 and interface (I/F) 235.

Stack0 210a is operatively coupled to stack1 210b using interconnect 251. Interconnect 251 links channel group1 215a of stack0 210a with channel group0 214b of stack1 210b, communication link0 output 222a of stack0 210a with communication link0 input 221b of stack1 210b, and communication link1 input 223a of stack0 210a with communication link1 output 224b of stack1 210b. Stack1 210b is operatively coupled to stack2 210c using interconnect 252. Interconnect 252 links channel group1 215b of stack1 210b with channel group0 214c of stack2 210c, communication link0 output 222b of stack1 210b with communication link0 input 221c of stack2 210c, and communication link1 input 223b of stack1 210b with communication link1 output 224c of stack2 210c. Stack2 210c is operatively coupled to stack3 210d using interconnect 253. Interconnect 253 links channel group1 215c of stack2 210c with channel group0 214d of stack3 210d, communication link0 output 222c of stack2 210c with communication link0 input 221d of stack3 210d, and communication link1 input 223c of stack2 210c with communication link1 output 224d of stack3 210d.

Interface 234 of host 230 is operatively coupled to stack0 210a using interconnect 254. Interconnect 254 links channel group0 214a of stack0 210a, communication link0 input 221a, and communication link1 output 224a to interface 234. Interface 235 of host 230 is operatively coupled to stack3 210d using interconnect 255. Interconnect 255 links channel group1 215d of stack3 210d, communication link0 output 222d, and communication link1 input 223d to interface 235.

In an embodiment, communication link0 inputs 221a-221d, communication link0 outputs 222a-222d, communication link1 inputs 223a-223d, communication link1 outputs 224a-224d, interface 234, and interface 235 are interconnected in a ring topology. In particular, a ring that can carry commands and/or data in a clockwise direction (in FIGS. 2A-2C) is formed by communication link0 inputs 221a-221d, communication link0 outputs 222a-222d, interface 234, and interface 235. Similarly, a ring that can carry commands and/or data in a counterclockwise direction (in FIGS. 2A-2C) is formed by communication link1 inputs 223a-223d, communication link1 outputs 224a-224d, interface 234, and interface 235. Finally, another ring to carry information in a clockwise direction is formed by channel group0 channels 214a-214d, channel group1 channels 215a-215d, interface 234, and interface 235.

A handshake protocol implemented using communication link0 inputs 221a-221d, communication link0 outputs 222a-222d, communication link1 inputs 223a-223d, communication link1 outputs 224a-224d, interface 234, and interface 235 may be used to facilitate data, command, and/or software transfers made via channel group0 channels 214a-214d acting as inputs to each device stack 210a-210d and channel group1 channels 215a-215d acting as outputs from each device stack 210a-210d. For example, to communicate data between device stack0 210a as the sender and device stack1 210b as the receiver, the following may be performed: (1) device stack1 210b communicates, via com1o224b, that device stack1 210b is ready to receive data; (2) device stack0 210a configures at least one command/address bus interface of a channel group1 215a to drive commands/addresses to a corresponding command/address bus interface of a channel group0 214b; (3) device stack0 210a sends write commands, addresses, and data addressed to a range of memory addresses (aperture) of device stack1 210b; (4) device stack0 210a communicates, via com0o222a, that the data write to the aperture has been completed; (5) device stack1 210b uses the data and/or transfers the data to the next device stack (i.e., device stack2 210c) in the ring.

Table 1 illustrates an example command format for communicating commands via communication link0 inputs 221a-221d, communication link0 outputs 222a-222d, communication link1 inputs 223a-223d, communication link1 outputs 224a-224d, interface 234, and/or interface 235.

TABLE 1

| Cycle # | Bit 7 | Bit 6 | Bit 5 | Bit 4 | Bit 3 | Bit 2 | Bit 1 | Bit 0 | notes |
|---|---|---|---|---|---|---|---|---|---|
| 1 | BUF | RSV | ID0 | ID0 | ID0 | ID0 | BCST | CMD | Send/receive config; |
| 2 | ECHO | LTCH | SND | RCV | RDY | FIN | RTRY | ERR | ready/finished; command parameters |

TABLE 1-continued

| Cycle # | Bit 7 | Bit 6 | Bit 5 | Bit 4 | Bit 3 | Bit 2 | Bit 1 | Bit 0 | notes |
|---|---|---|---|---|---|---|---|---|---|
| 3 | SZ7 | SZ6 | SZ5 | SZ4 | SZ3 | SZ2 | SZ1 | SZ0 | SZ bits indicate size of transfer |
| 4 | SZ11 | SZ10 | SZ9 | SZ8 | VAL0 | VAL1 | VAL2 | VAL3 | Command specific data value |

Table 2 further details the example meanings of the mnemonics illustrated in Table 1.

TABLE 2

| Bit field name | Description | Value meaning |
|---|---|---|
| SND | Sender | SND = 1 means message is coming from the sender |
| RCV | Receiver | RCV = 1 means message is coming from the receiver |
| RDY | Ready | RDY = 1 means sender/receiver is ready to send/receive data |
| FIN | Finished | FIN = 1 means sender/receiver is finished transmitting/receiving data |
| BUF | Buffer number | In a double buffered communication, this bit indicates the number of the buffer being written/read |
| BCST | Broadcast | BCST = 1 means forward this command to all stacks in the ring |
| CMD | Command | CMD = 1 means this command is from the host |
| ECHO | Echo | ECHO = 1 means device stack is to forward commands/addresses and data written to the aperture to the next device stack on the ring |
| LTCH | Latch | LTCH = 1 means device stack is to operate/consume on the data written to the aperture |
| ERR | Error | ERR = 1 means an error has occurred |
| RTRY | Retry | RTRY = 1 means retry the data transfer |
| VAL | Data values | Command specific data values. For example, a command to set an identification number for a stack would transmit the value to be set via the VAL3-VAL0 bits. |
| RSV | Reserved | Reserved for future use |

FIGS. 2B-2C illustrate a configurable stacked device system interconnection. In FIGS. 2B-2C, system 201 is configurable to add or remove host 230 from the ring topology. In FIGS. 2B-2C, system 201 comprises device stacks 210a-210d, host 230, and interconnect selectors 241-242. System 201 also includes interconnects 251-253, 261-265. Interconnect 261 operatively couples the output of interconnect selector 241 to device stack0 210a. Interconnect 263 operatively couples interface 234 to a first input of interconnect selector 241. A second input of interconnect selector 241 is operatively coupled to a first output of interconnect selector 242. A second output of interconnect selector 242 is operatively coupled to interface 235. Stack3 210d is operatively coupled to the input of interconnect selector 242. Thus, it should be understood that when interconnect selectors 241-242 are configured to interconnect device stack3 210d with interface 235 and to interface 234 with device stack 0 210a, the configuration illustrated in FIG. 2A is achieved.

When interconnect selectors 241-242 are configured to interconnect device stack3 210d with device stack 0 210a, a ring topology that does not include host 230 is achieved. This configuration is illustrated in FIG. 2C by not showing inactive interconnections 263-264.

Figure 3A:
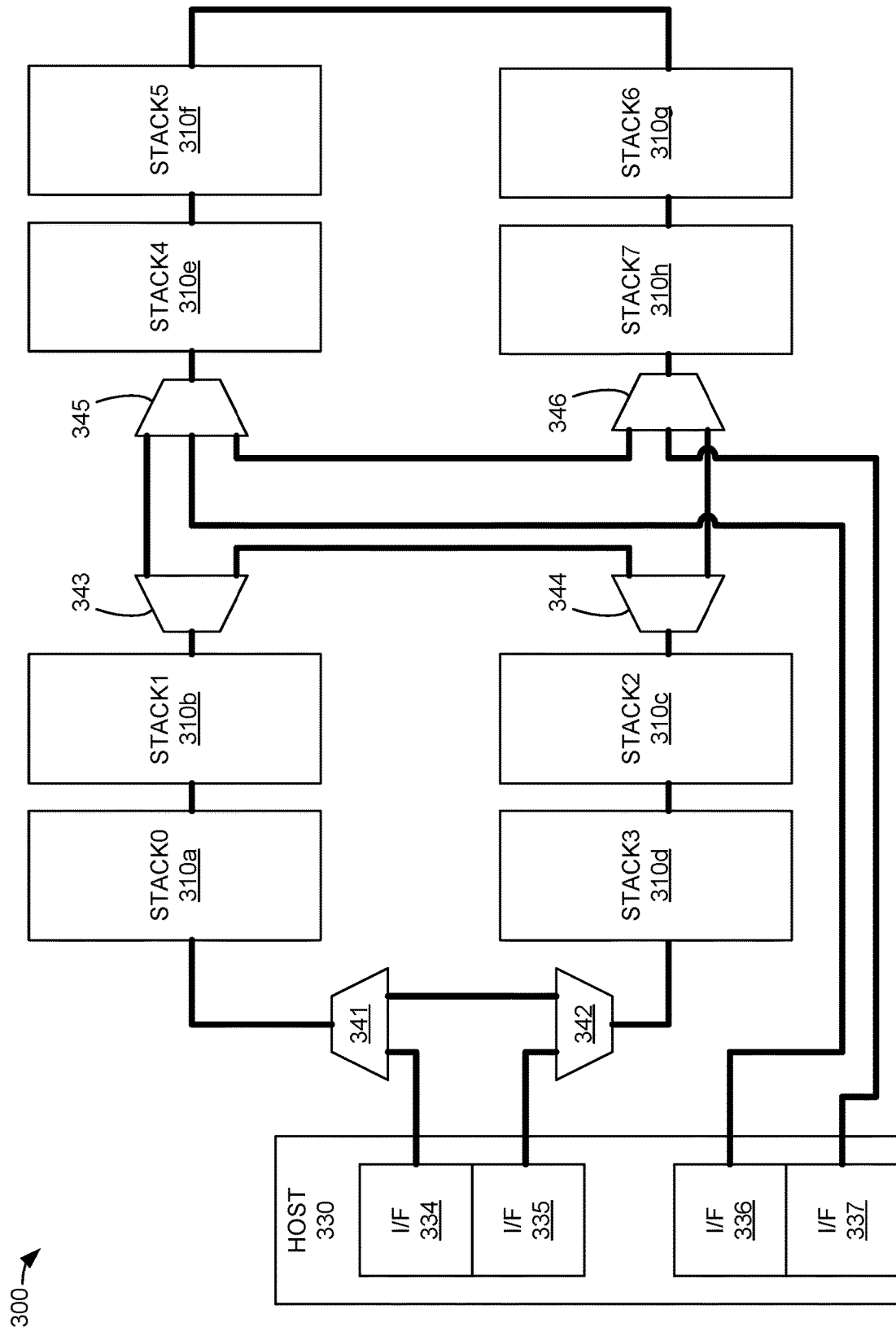
FIGS. 3A-3C are diagrams illustrating scalable stacked device system interconnection configurations.
Figure 3B:
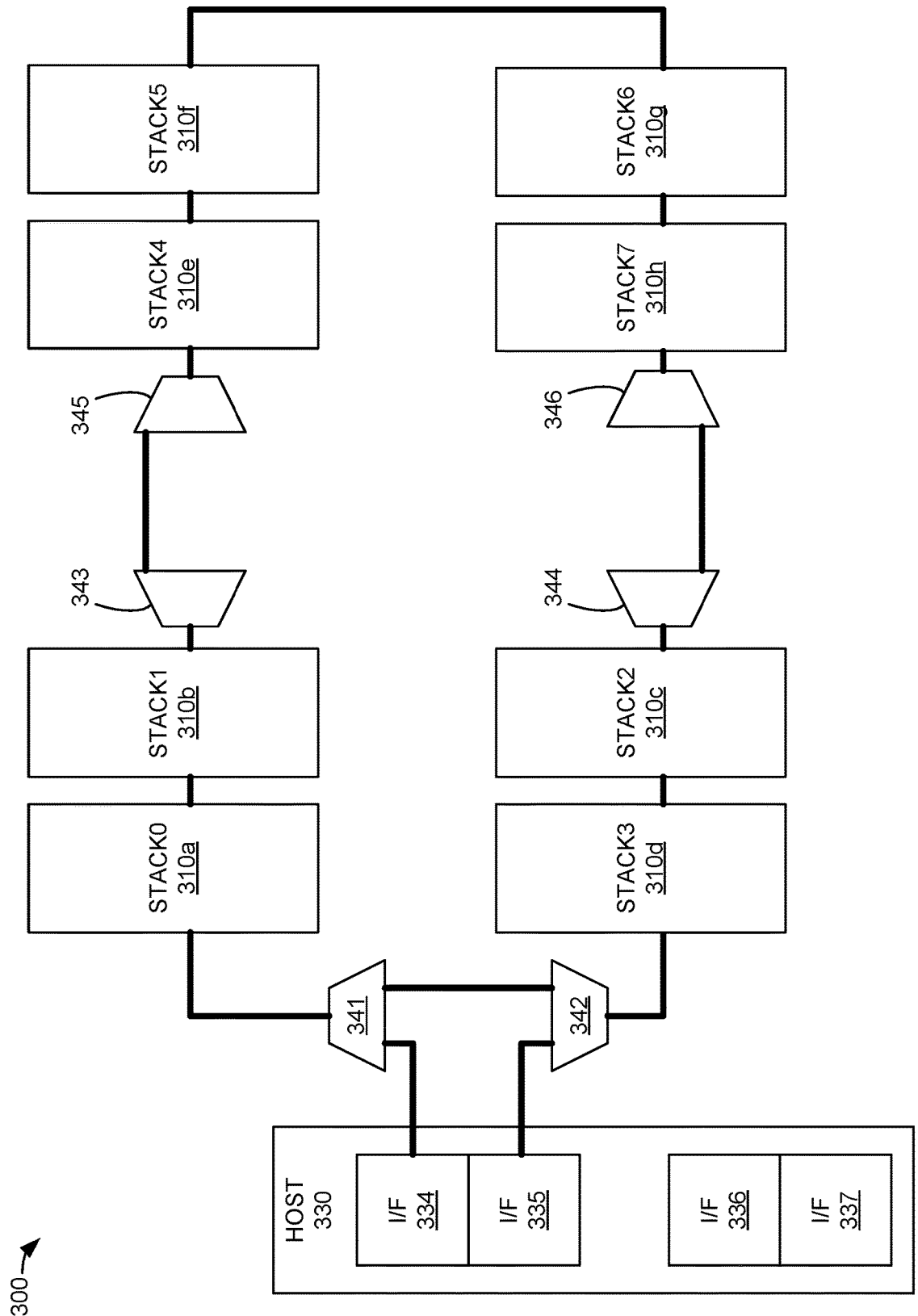
Figure 3C:
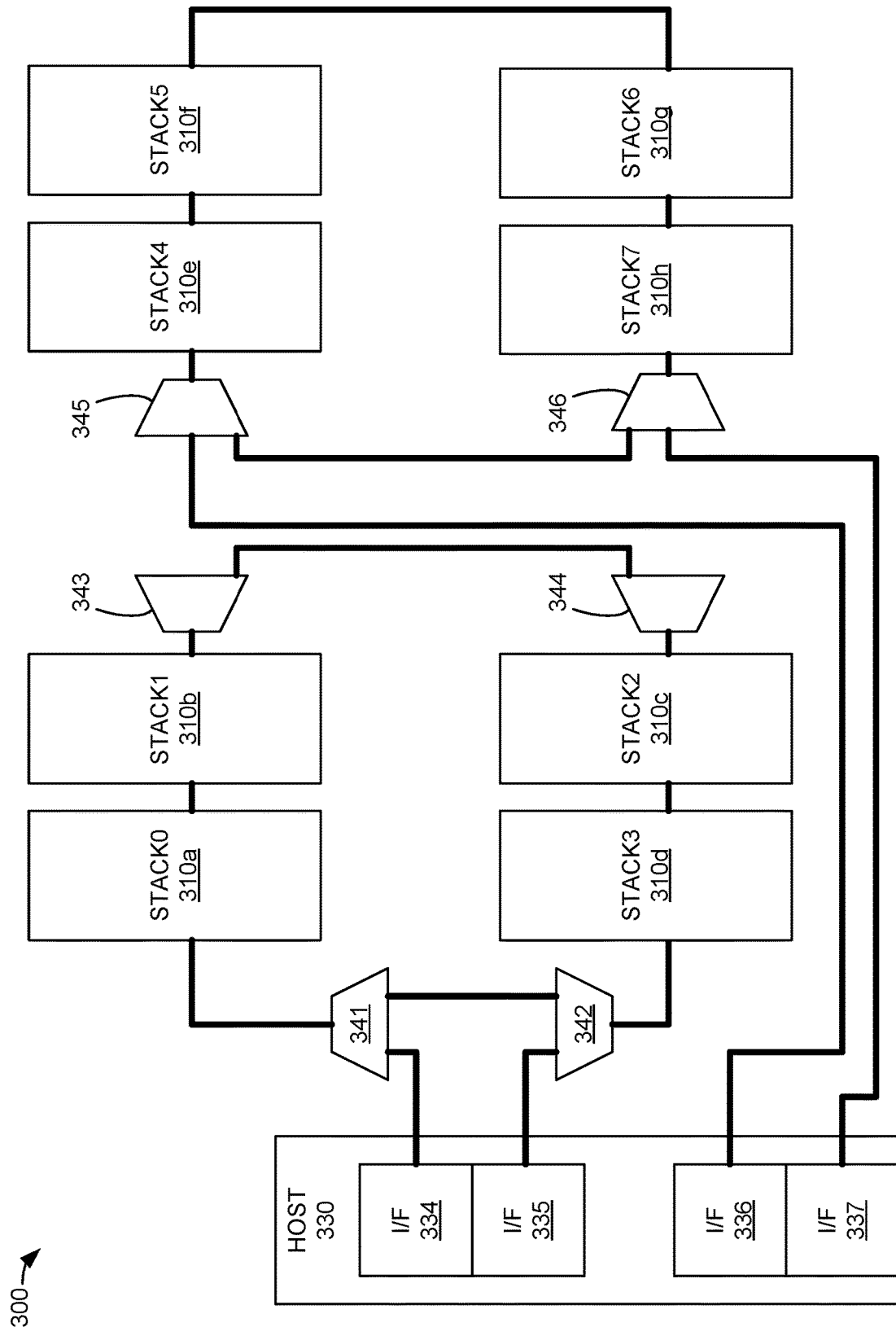

FIGS. 3A-3C are diagrams illustrating scalable stacked device system interconnection configurations. In FIGS. 3A-3C, system 300 comprises device stacks 310a-310h, and host 330. System 300 also includes interconnect selectors 341-346. Host 330 includes interfaces 334-337. Device stacks 310a-310h may each include a plurality of memory device dies (e.g., DRAMs) and one or more processing device dies. These processing device dies and/or host 330, may be, or include, an application specific integrated circuit (ASIC) device, a graphics processor unit (GPU), a central processing unit (CPU), a system-on-chip (SoC), or an integrated circuit device that includes many circuit blocks such as ones selected from graphics cores, processor cores, and MPEG encoder/decoders, etc.

Interconnect selector 341 is operatively coupled with interface 334, interconnect selector 342, and stack0 310a. Interconnect selector 342 is operatively coupled with interface 335, interconnect selector 341, and stack3 310d. Stack0 310a is operatively coupled with stack1 310b. Interconnect selector 343 is operatively coupled with interconnect selector 344, interconnect selector 345, and stack1 310b. Interconnect selector 344 is operatively coupled with interconnect selector 343, interconnect selector 346, and stack2 310c. Stack2 310c is operatively coupled with stack3 310d. Interconnect selector 345 is operatively coupled with interconnect selector 343, interface 336, interconnect selector 346, and stack4 310e. Stack4 310e is operatively coupled to stack5 310f. Stack5 310f is operatively coupled to stack6 310g. Stack6 310g is operatively coupled to stack7 310h. Interconnect selector 346 is operatively coupled with interconnect selector 344, interface 337, interconnect selector 345, and stack7 310h.

Using interconnect selectors 341-346, system 300 may be configured in a single-ring topology. System 300 may be further configured to include or exclude host 330 from this ring topology. This topology is illustrated in FIG. 3B by not showing inactive interconnections. System 300 may also be configured in a multiple-ring topology. System 300 may be further configured to either include or exclude host 330 from one or more of the multiple rings. This multiple ring topology is illustrated in FIG. 3C by not showing inactive interconnections.

FIG. 4 is a flowchart illustrating a method of operating a stacked device system. One or more steps illustrated in FIG.

4 may be performed by, for example, system 100, system 200, system 201, system 300, and/or their components. By a first device stack comprising a first set of stacked memory devices and a first set of one or more processing devices electrically coupled to, and stacked with, the first set of stacked memory devices, a first copy of a first neural network model is received (402). For example, host 230 may transmit via interconnect 254 and to device stack0 210a, programming and/or neural network model parameters (e.g., topology, interconnect weights, etc.) that can be used by device stack0 210a to implement a neural network model. Host 230 may also transmit via interconnect 254 a first partial training dataset to be used by device stack0 210a to train its copy of the neural network model.

By a second device stack comprising a second set of stacked memory devices and a second set of one or more processing devices electrically coupled to, and stacked with, the second set of stacked memory devices, a second copy of the first neural network model is received (404). For example, under instructions from host 230, device stack0 210a may relay, via interconnect 251 and to device stack1 210b, the programming and/or neural network model parameters (e.g., topology, interconnect weights, etc.) received from host 230 that can be used by device stack1 210b to implement the neural network model. Host 230 may also transmit via device stack0 210a a second partial training dataset to be used by device stack1 210b to train the neural network model.

The first copy of the first neural network model is trained using a first portion of first neural network model training data to generate first updated neural network model parameters (406). For example, device stack0 210a, using the first partial training dataset, train its copy of the neural network model to generate a first set of updated neural network model parameters. The second copy of the first neural network model is trained using a second portion of first neural network model training data (408). For example, device stack1 210b, using the second partial training dataset, train its copy of the neural network model to generate a second set of updated neural network model parameters.

The first updated neural network model parameters are communicated to the second device stack using a handshake protocol (410). For example, using a handshake protocol to set up and facilitate communication, the first set of updated neural network model parameters may be communicated from device stack0 210a to device stack 1210b.

The second updated neural network model parameters are communicated to the first device stack using the handshake protocol (412). For example, using the handshake protocol to set up and facilitate communication between device stacks 210b-210d and (optionally) host 230, the second set of updated neural network model parameters may be communicated from device stack1 210b to device stack0 210a via a ring topology that includes device stacks 210a-210d and (optionally) host 230.

FIG. 5 is a flowchart illustrating a method of reconfiguring a stacked device system. One or more steps illustrated in FIG. 5 may be performed by, for example, system 100, system 201, system 300, and/or their components. The interconnect used by a plurality of device stacks is configured in a first ring topology that includes a host device, where the device stacks include at least one processing device (502). For example, the interconnect 251-253, 261-264 of system 201 may be configured in a first ring topology that includes host 230 by configuring interconnect selector 242 to route communication between device stack3 210d and interface 235 and configuring interconnect selector 241 to route communication between interface 234 and communication device stack 210a.

The interconnect used by the plurality of device stacks is configured in a second ring topology that does not include the host device (504). For example, the interconnect 251-253, 261-265 of system 201 may be configured in a first ring topology that does not include host 230 by configuring interconnect selector 242 to route communication between device stack3 210d and interconnect selector 241 and configuring interconnect selector 241 to route communication between interconnect selector 242 and communication device stack 210a.

Figure 6:
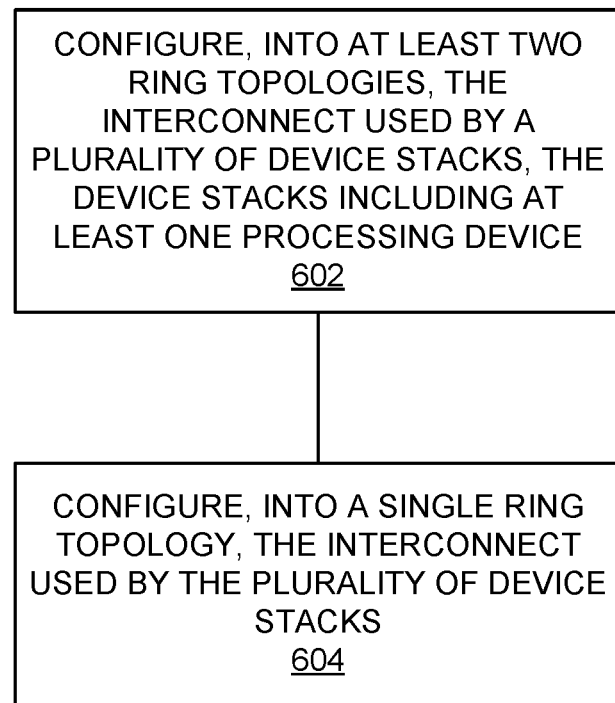
FIG. 6 is a flowchart illustrating a method of configuring a stacked device system to partition processing.

FIG. 6 is a flowchart illustrating a method of configuring a stacked device system to partition processing. One or more steps illustrated in FIG. 6 may be performed by, for example, system 100, system 300, and/or their components. The interconnect used by a plurality of device stacks is configured into at least two ring topologies where the interconnect used by the plurality of device stacks, and where the device stacks include at least one processing device (602). For example, the interconnect of system 300 may be configured to concurrently have both a first ring topology and a second ring topology.

The first ring topology may be made by: (a) configuring interconnect selector 343 to route communication between device stack1 310b and interconnect selector 344; and, (b) configuring interconnect selector 344 to route communication between interconnect selector 343 and device stack2 310c; and (c) either: (1) configuring interconnect selector 341 to route communication between interface 334 and device stack0 310a and configuring interconnect selector 342 to route communication between device stack3 310d and interface 335; or, (2) configuring interconnect selector 341 to route communication between interconnect selector 342 and device stack0 310a and configuring interconnect selector 342 to route communication between device stack3 310d and interconnect selector 341.

The second ring topology may be made by either: (1) configuring interconnect selector 345 to route communication between interface 336 and device stack4 310e and configuring interconnect selector 346 to route communication between device stack7 310h and interface 337; or, (2) configuring interconnect selector 345 to route communication between interconnect selector 346 and device stack4 310e and configuring interconnect selector 346 to route communication between device stack7 310h and interconnect selector 345.

The interconnect used by the plurality of device stacks is configured into a single ring topology (604). For example, the interconnect of system 300 may be configured into a single ring topology. The single ring topology may be made by: (a) configuring interconnect selector 343 to route communication between device stack1 310b and interconnect selector 345; and, (b) configuring interconnect selector 346 to route communication between device stack7 310h and interconnect selector 344; and (c) either: (1) configuring interconnect selector 341 to route communication between interface 334 and device stack0 310a and configuring interconnect selector 342 to route communication between device stack3 310d and interface 335; or, (2) configuring interconnect selector 341 to route communication between interconnect selector 342 and device stack0 310a and configuring interconnect selector 342 to route communication between device stack3 310d and interconnect selector 341.

Figure 7B:
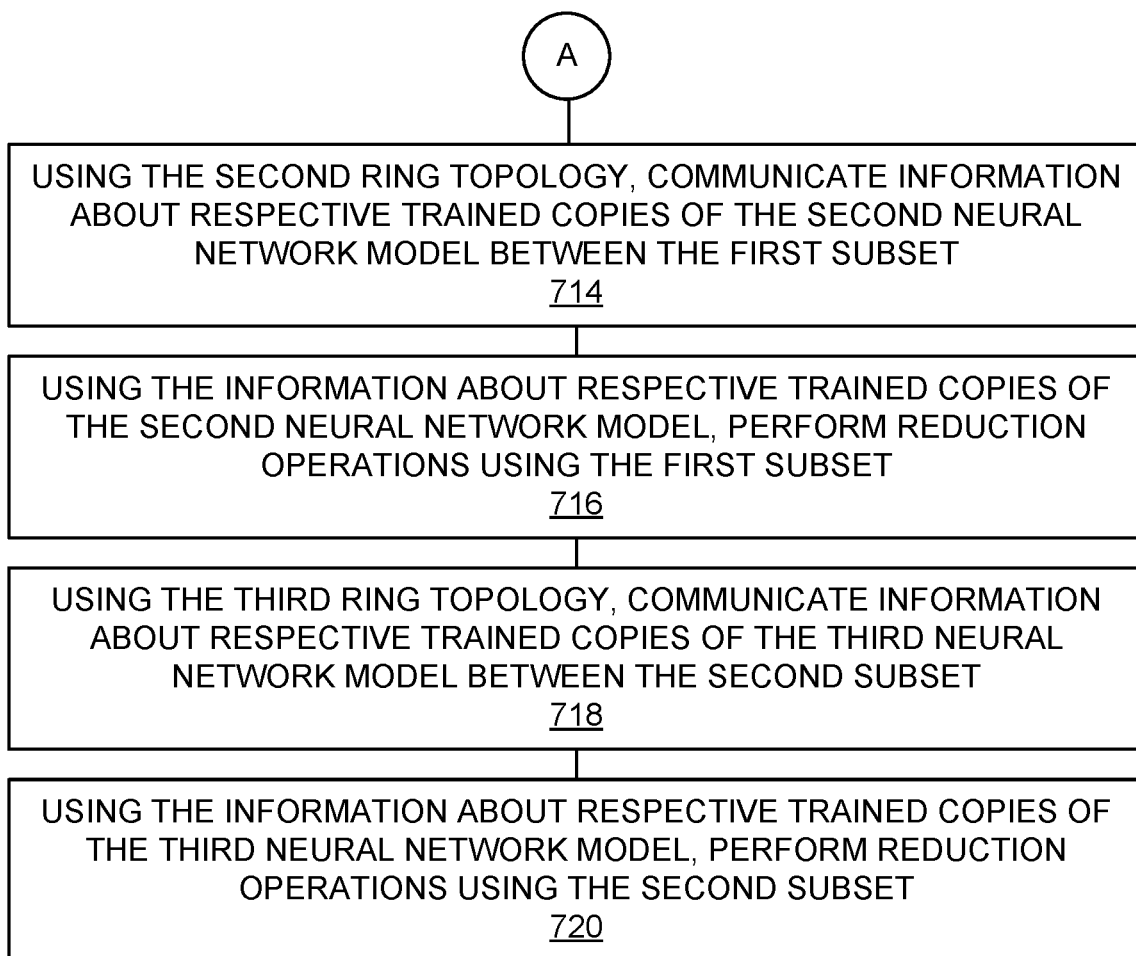

FIGS. 7A-7B are a flowchart illustrating methods of training neural network models with a stacked device system. One or more steps illustrated in FIG. 7 may be performed by, for example, system 100, system 200, system 201, system 300, and/or their components. The interconnect used by a plurality of device stacks is configured into a first ring topology, the device stacks each including at least one processing device (702). For example, the interconnect of system 300 may be configured into a single ring topology that includes device stacks 310a-310h.

Respective copies of a first neural network model are trained using the plurality of device stacks and respective portions of a first training data set (704). For example, each device stack 310a-310h may use a unique (with respect to the other device stacks 310a-310h) set of training data (whose training data sets may overlap or be disjoint) to concurrently train their respective copies of a first neural network model. Using the first ring topology, information about the respective trained copies of the first neural network model are communicated between the plurality of device stacks (706). For example, device stacks 310a-310h may communicate their updated model parameters (e.g., weights) with the other device stacks 310a-310h by passing their updated model parameters and relaying the updated model parameters received from other device stacks 310a-310h around the single ring topology. This relaying may be part of, for example, a concurrent (parallel) training algorithm known as Ring-AllReduce.

Using the information about respective trained copies of the first neural network model reduction operations are performed using the plurality of device stacks (708). For example, device stacks 310a-310h may use their own updated model parameters and the updated model parameters from the other device stacks 310a-310h to produce new model parameters to be used in the next training iteration. This process may continue through further iterations and/or distributions of partial training data until the training of the first neural network model is complete (e.g., converges). This updating may be part of, for example, the concurrent (parallel) training algorithm known as Ring-AllReduce.

The interconnect used by the plurality of device stacks is configured into a second ring topology and a third ring topology, the second ring topology and the third ring topology including a first subset and a second subset of the plurality of device stacks, respectively (710). For example, the interconnect of system 300 may be configured to concurrently have a plurality of ring topologies. In particular, device stacks 310a-310d may be configured into a first ring topology as described and device stacks 310e-310h may be configured into a second ring topology as described herein. Respective copies of a second neural network model are trained using the first subset and respective portions of a second training data set (712). For example, each device stack 310a-310d of the first ring topology may use a unique (with respect to the other device stack 310a-310d of the first ring topology) set of training data (whose training data sets may overlap or be disjoint) to concurrently train their respective copies of a second neural network model.

Concurrent with training the second neural network model using the first subset, respective copies of a third neural network model are trained using the second subset and respective portions of a third training data set (714). For example, concurrent with the first ring topology device stacks 310a-310d training the second neural network model, each device stack 310e-310h of the second ring topology may use a unique (with respect to the other device stack 310e-310h of the second ring topology) set of training data (whose training data sets may overlap or be disjoint) to concurrently train their respective copies of a third neural network model.

Using the second ring topology, information about respective trained copies of the second neural network model is communicated between the first subset (714). For example, device stacks 310a-310d of the first ring topology may communicate their updated model parameters (e.g., weights) with the other device stacks 310a-310d of the first ring topology by passing their updated model parameters and relaying the updated model parameters received from other device stacks 310a-310d around the first ring topology. This relaying may be part of, for example, a concurrent (parallel) training algorithm known as Ring-AllReduce.

Using the information about respective trained copies of the second neural network model reduction operations are performed using the first subset (716). For example, device stacks 310a-310d of the first ring topology may use their own updated model parameters and the updated model parameters from the other device stacks 310a-310d of the first ring topology to produce new model parameters to be used in the next training iteration. This process may continue through further iterations and/or distributions of partial training data until the training of the second neural network model is complete (e.g., converges). This updating may be part of, for example, the concurrent (parallel) training algorithm known as Ring-AllReduce.

Using the third ring topology, information about respective trained copies of the third neural network model are communicated between the second subset (718). For example, device stacks 310e-310h of the second ring topology may communicate their updated model parameters (e.g., weights) with the other device stacks 310e-310h of the second ring topology by passing their updated model parameters and relaying the updated model parameters received from other device stacks 310e-310h around the second ring topology. This relaying may be part of, for example, a concurrent (parallel) training algorithm known as Ring-AllReduce.

Using the information about respective trained copies of the third neural network model, perform reduction operations using the second subset (720). For example, device stacks 310e-310h of the second ring topology may use their own updated model parameters and the updated model parameters from the other device stacks 310e-310h of the second ring topology to produce new model parameters to be used in the next training iteration. This process may continue through further iterations and/or distributions of partial training data until the training of the third neural network model is complete (e.g., converges). This updating may be part of, for example, the concurrent (parallel) training algorithm known as Ring-AllReduce.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, system 201, system 300, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
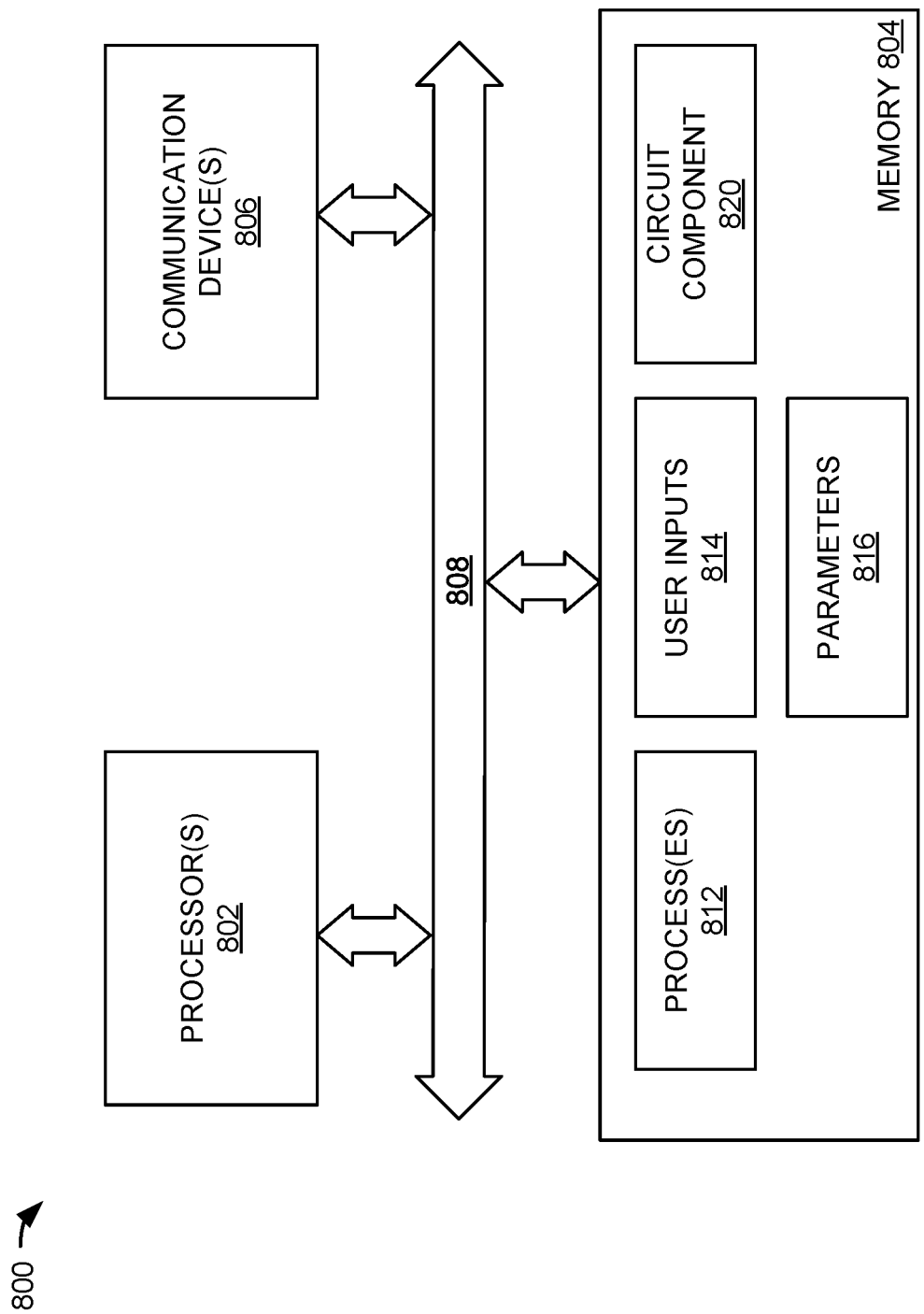
FIG. 8 is a block diagram illustrating a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of system 100, system 200, system 201, system 300, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A system, comprising: a first plurality of device stacks comprising a first set of stacked memory devices and a first set of one or more processing devices electrically coupled to, and stacked with, the first set of stacked memory devices, the memory devices comprising memory cell circuitry, the first set of processing devices comprising at least one processing element; and, first device stack interconnect coupling each of the first plurality of device stacks to at least one other of the first plurality of device stacks, the first plurality of device stacks configurable to use a handshake protocol for communication via the first device stack interconnect, the first plurality of device stacks configurable to operate on portions of a first data set and communicate information via the first device stack interconnect to perform reduction operations.

Example 2: The system of claim 1, wherein each of the first plurality of device stacks is configurable with a first neural network model and is to train a respective copy of the first neural network model using a respective portion of first neural network model training data.

Example 3: The system of claim 2, wherein each of the first plurality of device stacks trains the respective copy of the first neural network model and communicates updated first neural network model parameters of the respective copy of the first neural network model with each of the other of the first plurality of device stacks.

Example 4: The system of claim 3, wherein communication of updated first neural network model parameters is performed using a first ring topology.

Example 5: The system of claim 4, further comprising: a second plurality of device stacks comprising a second set of stacked memory devices and a second set of one or more processing devices electrically coupled to, and stacked with, the second set of stacked memory devices, the memory devices comprising memory cell circuitry, the second set of processing devices comprising at least one processing element; and, second device stack interconnect coupling each of the second plurality of device stacks to at least one other of the second plurality of device stacks, the second plurality of device stacks configurable to use the handshake protocol for communication via the second device stack interconnect, the second plurality of device stacks configurable to operate on portions of a second data set and communicate information via the second device stack interconnect to perform reduction operations.

Example 6: The system of claim 5, wherein each of the second plurality of device stacks is configurable with a second neural network model and is to train a respective copy of the second neural network model using a respective portion of second neural network model training data.

Example 7: The system of claim 6, wherein communication of updated second neural network model parameters is performed using a second ring topology.

Example 8: The system of claim 7, wherein the first plurality of device stacks forming the first ring topology and the second plurality of device stacks forming the second ring topology are disjoint sets.

Example 9: An integrated circuit stack, comprising: a first set of stacked memory devices; a first processing device electrically coupled to, and stacked with, the first set of stacked memory devices to form a first device stack, the first set of memory devices comprising memory cell circuitry, the first processing device comprising at least one processing element; and, first device stack interface to couple the first processing device to a second processing device stacked with a second set of stacked memory devices that forms a second device stack and to use a handshake protocol for communication with the second processing device via the first device stack interface, the first processing device configurable to operate on portions of a first data set and communicate information to the second processing device via the first device stack interconnect to perform reduction operations.

Example 10: The integrated circuit stack of claim 9, wherein the first device stack is to store a first neural network model and is to train a first copy of the first neural network model using a first portion of first neural network model training data.

Example 11: The integrated circuit stack of claim 10, wherein the first device stack is to train the first copy of the first neural network model and is to communicate updated first neural network model parameters of the first copy of the first neural network model to the second device stack.

Example 12: The integrated circuit stack of claim 11, further comprising: a second device stack interface to couple the first processing device to a third processing device stacked with a third set of stacked memory devices that forms a third device stack and to use the handshake protocol for communication with the third processing device via the second device stack interface.

Example 13: The integrated circuit stack of claim 12, wherein the third device stack is to store the first neural network model and is to train a second copy of the first neural network model using a second portion of first neural network model training data.

Example 14: The integrated circuit stack of claim 13, wherein the third device stack is to communicate updated first neural network model parameters of the second copy of the first neural network model to the first device stack.

Example 15: The integrated circuit stack of claim 12, wherein the first device stack, the second device stack, and the third device stack are part of a ring communication topology.

Example 16: A method, comprising: receiving, by a first device stack comprising a first set of stacked memory devices and a first set of one or more processing devices electrically coupled to, and stacked with, the first set of stacked memory devices, a first copy of a first neural network model; receiving, by a second device stack comprising a second set of stacked memory devices and a second set of one or more processing devices electrically coupled to, and stacked with, the second set of stacked memory devices, a second copy of the first neural network model; training the first copy of the first neural network model using a first portion of first neural network model training data to generate first updated neural network model parameters;
training the second copy of the first neural network model using a second portion of first neural network model training data; communicating the first updated neural network model parameters to the second device stack using a handshake protocol; and, communicating the second updated neural network model parameters to the first device stack using the handshake protocol.

Example 17: The method of claim 16, wherein the first updated neural network model parameters and the second updated neural network model parameters are communicated via a ring topology comprising a plurality of device stacks.

Example 18: The method of claim 16, further comprising: using, by the first stack, the first updated neural network model parameters and the second updated neural network model parameters to generate third updated neural network model parameters.

Example 19: The method of claim 18, further comprising: updating the first copy of the first neural network model with the third updated neural network model parameters.

Example 20: The method of claim 19, further comprising: after updating the first copy of the first neural network model with the third updated neural network model parameters, training the first copy of the first neural network model using the first portion of first neural network model training data to generate fourth updated neural network model parameters.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit stack, comprising:
a first set of stacked memory devices and a first set of one or more processing devices electrically coupled to, and stacked with, the first set of stacked memory devices, the memory devices comprising memory cell circuitry, the first set of processing devices comprising at least one processing element; and
a device stack interconnect interface to couple the integrated circuit stack to device stack interconnect to couple at least one of a first plurality of device stacks and a second plurality of device stacks, the first plurality of device stacks to be configured in a first ring topology for communication via the device stack interconnect, the first plurality of device stacks to be configured to operate on portions of a first data set and communicate information via the device stack interconnect to perform reduction operations, the first plurality of device stacks and the second plurality of device stacks to be configured in a second ring topology for communication via the device stack interconnect, the first plurality of device stacks and the second plurality of device stacks to be configured to operate on portions of a second data set and communicate information via the device stack interconnect to perform reduction operations.

2. The integrated circuit stack of claim 1, wherein, when the first plurality of device stacks is configured in the first ring topology, each of the first plurality of device stacks is to be configured with a first neural network model and is to train a respective copy of the first neural network model using a respective portion of first neural network model training data.

3. The integrated circuit stack of claim 2, wherein, when the first plurality of device stacks and the second plurality of device stacks are configured in the second ring topology, each of the first plurality of device stacks and second plurality of device stacks is to be configured with a second neural network model and is to train a respective copy of the second neural network model using a respective portion of second neural network model training data.

4. The integrated circuit stack of claim 3, wherein, when the first plurality of device stacks is configured in the first ring topology, each of the first plurality of device stacks is to train the respective copy of the first neural network model and communicate updated first neural network model parameters of the respective copy of the first neural network model with each of the other of the first plurality of device stacks.

5. The integrated circuit stack of claim 4, wherein, when the first plurality of device stacks and the second plurality of device stacks are configured in the second ring topology, each of the first plurality of device stacks and the second plurality of device stacks are to train the respective copy of the second neural network model and communicate updated second neural network model parameters of the respective copy of the second neural network model with each of the other of the second plurality of device stacks.

6. The integrated circuit stack of claim 5, wherein communication of updated first neural network model parameters is to be performed using the first ring topology, and communication of updated second neural network model parameters is to be performed using the second ring topology.

7. The integrated circuit stack of claim 6, wherein the first ring topology is to include a host system.

8. The integrated circuit stack of claim 6, wherein the second ring topology is to include a host system.

9. An integrated circuit stack, comprising:
a first set of stacked memory devices;
a first processing device electrically coupled to, and stacked with, the first set of stacked memory devices to form a first device stack, the first set of memory devices comprising memory cell circuitry, the first processing device comprising at least one processing element;
first device stack interface to couple, via first device stack interconnect, the first processing device to a first plurality of processing devices stacked with respective first sets of stacked memory devices that form a first plurality of device stacks, the first processing device configurable to operate on portions of a first data set and communicate information to the first plurality of processing devices via the first device stack interconnect to perform reduction operations, the first device stack interconnect to be configured in a first ring topology; and
the first device stack interconnect to be configured in a second ring topology to couple the first plurality of device stacks with a second plurality of device stacks, a second plurality of processing devices being stacked with respective second sets of stacked memory devices that form the second plurality of device stacks.

10. The integrated circuit stack of claim 9, wherein the first device stack is to store a first neural network model and is to train a first copy of the first neural network model using a first portion of first neural network model training data.

11. The integrated circuit stack of claim 10, wherein the first device stack is to train the first copy of the first neural network model and is to communicate updated first neural network model parameters of the first copy of the first neural network model to the first plurality of device stacks.

12. The integrated circuit stack of claim 11, further comprising:
a second device stack interface to couple, via second device stack interconnect, the first processing device to a third processing device stacked with a third set of stacked memory devices that forms a third device stack.

13. The integrated circuit stack of claim 12, wherein the third device stack is to store the first neural network model and is to train a second copy of the first neural network model using a second portion of first neural network model training data.

14. The integrated circuit stack of claim 13, wherein the third device stack is to communicate updated first neural network model parameters of the second copy of the first neural network model to the first device stack via the second device stack interconnect.

15. The integrated circuit stack of claim 12, wherein the first device stack and the second device stack interconnect are to form a plurality of ring communication topologies.

16. A method, comprising:
receiving, by a first device stack comprising a first set of stacked memory devices and a first set of one or more processing devices electrically coupled to, and stacked with, the first set of stacked memory devices, a first copy of a first neural network model;
receiving, by a second device stack comprising a second set of stacked memory devices and a second set of one or more processing devices electrically coupled to, and stacked with, the second set of stacked memory devices, a second copy of the first neural network model;
receiving, by a third device stack comprising a third set of stacked memory devices and a third set of one or more processing devices electrically coupled to, and stacked with, the third set of stacked memory devices, a first copy of a second neural network model;
receiving, by a fourth device stack comprising a fourth set of stacked memory devices and a fourth set of one or more processing devices electrically coupled to, and stacked with, the fourth set of stacked memory devices, a second copy of the second neural network model;
training the first copy of the first neural network model using a first portion of first neural network model training data to generate first updated first neural network model parameters;
training the second copy of the first neural network model using a second portion of first neural network model training data to generate second updated first neural network model parameters;
training the first copy of the second neural network model using a first portion of second neural network model training data to generate first updated second neural network model parameters;
training the second copy of the second neural network model using a second portion of second neural network model training data to generate second updated second neural network model parameters;
communicating the first updated first neural network model parameters to the second device stack using a first ring communication topology;
communicating the second updated first neural network model parameters to the first device stack using the first ring communication topology;

communicating the first updated second neural network model parameters to the fourth device stack using a second ring communication topology; and, communicating the second updated second neural network model parameters to the third device stack using the second ring communication topology.

17. The method of claim 16, further comprising:

communicating the first updated second neural network model parameters and the second updated second neural network model parameters to the first device stack using a third ring communication topology.

18. The method of claim 17, further comprising:

using, by the first stack, the first updated second neural network model parameters and the second updated second neural network model parameters to generate third updated first neural network model parameters.

19. The method of claim 18, further comprising:

updating the first copy of the first neural network model with the third updated first neural network model parameters.

20. The method of claim 19, further comprising:

after updating the first copy of the first neural network model with the third updated first neural network model parameters, training the first copy of the first neural network model using the first portion of first neural network model training data to generate fourth updated first neural network model parameters.

* * * * *